United States Patent
Kurahashi et al.

(10) Patent No.: US 10,804,003 B2
(45) Date of Patent: Oct. 13, 2020

(54) CONDUCTIVE PASTE FOR FORMING SOLAR CELL ELECTRODE

(71) Applicant: SHOEI CHEMICAL INC., Tokyo (JP)

(72) Inventors: Masayuki Kurahashi, Tokyo (JP); Naoto Shindo, Tokyo (JP); Kosuke Nishimura, Tokyo (JP)

(73) Assignee: SHOEI CHEMICAL INC., Tokyo (JP)

( * ) Notice: Subject to any disclaimer, the term of this patent is extended or adjusted under 35 U.S.C. 154(b) by 0 days.

(21) Appl. No.: 16/753,708

(22) PCT Filed: Sep. 26, 2018

(86) PCT No.: PCT/JP2018/035716
§ 371 (c)(1),
(2) Date: Apr. 3, 2020

(87) PCT Pub. No.: WO2019/069765
PCT Pub. Date: Apr. 11, 2019

(65) Prior Publication Data
US 2020/0273597 A1    Aug. 27, 2020

(30) Foreign Application Priority Data
Oct. 3, 2017    (JP) .................................. 2017-193432

(51) Int. Cl.
*H01B 1/00* (2006.01)
*C03C 4/00* (2006.01)
(Continued)

(52) U.S. Cl.
CPC ................. *H01B 1/22* (2013.01); *C03C 4/14* (2013.01); *C03C 8/04* (2013.01); *C03C 8/18* (2013.01);
(Continued)

(58) Field of Classification Search
CPC .... H01B 1/00; H01B 1/14; H01B 1/16; H01L 35/24; C03C 14/006
See application file for complete search history.

(56) References Cited

U.S. PATENT DOCUMENTS 8,551,368 B2 * 10/2013 Nakamura ............ C23C 18/127
                                                                252/514
9,064,616 B2 *  6/2015 Yoshida .................... C03C 8/18
                                    (Continued)

FOREIGN PATENT DOCUMENTS

CN    104751942 A    7/2015
JP    H10326522 A   12/1998
                    (Continued)

*Primary Examiner* — Mark Kopec
(74) *Attorney, Agent, or Firm* — Alleman Hall Creasman & Tuttle LLP

(57) ABSTRACT

Provided is a conductive paste for forming a solar cell electrode containing a glass frit component (A) as glass frit (II), the glass frit component (A) containing the following in the content ratio to the total molar number in terms of oxide: (a) 30 to 70 mol % of tellurium element, (b) 18 to 30 mol % of tungsten element, (c) 5 to 30 mol % of zinc element, (d) 1 to 15 mol % of boron element, (e) 0.3 to 5 mol % of aluminum element,
(f) 0.3 to 7 mol % of one or more selected from rare earth elements in terms of oxide, and
(g) 0.1 to 7 mol % of one or more selected from the group consisting of tin, lithium, and barium elements in terms of oxide.
The conductive paste may have better electric characteristics and a small variation in the characteristics even at a relatively low firing temperature (for example, 760° C.).

6 Claims, 1 Drawing Sheet

(51) Int. Cl.
*H01B 1/22* (2006.01)
*H01L 31/0224* (2006.01)
*C03C 4/14* (2006.01)
*C03C 8/04* (2006.01)
*C03C 8/18* (2006.01)

(52) U.S. Cl.
CPC .. *H01L 31/022425* (2013.01); *C03C 2204/00* (2013.01); *C03C 2205/00* (2013.01)

(56) References Cited

U.S. PATENT DOCUMENTS

| | | | |
|---|---|---|---|
| 10,249,774 B2* | 4/2019 | Kanasaku | C03C 8/04 |
| 2011/0232746 A1* | 9/2011 | Carroll | H01L 31/0264 136/256 |
| 2015/0191607 A1 | 7/2015 | Park et al. | |

FOREIGN PATENT DOCUMENTS

| | | |
|---|---|---|
| JP | H11213754 A | 8/1999 |
| JP | 2001093326 A | 4/2001 |
| JP | 2001118425 A | 4/2001 |
| JP | 2004207493 A | 7/2004 |
| JP | 2008543080 A | 11/2008 |
| JP | 2009194121 A | 8/2009 |
| JP | 2011096747 A | 5/2011 |
| JP | 2013534023 A | 8/2013 |
| JP | 2015122177 A | 7/2015 |
| JP | 2016103627 A | 6/2016 |
| JP | 2017010628 A | 1/2017 |
| WO | 2016147867 A1 | 9/2016 |

* cited by examiner

CONDUCTIVE PASTE FOR FORMING SOLAR CELL ELECTRODE

TECHNICAL FIELD

The present invention relates to a firing-type conductive paste that contains conductive powder and glass frit and is used for forming an electrode of a solar cell.

BACKGROUND ART

Conventionally, a general solar cell element includes a silicon-based semiconductor substrate, a diffusion layer, an antireflection film, a back electrode, and a surface electrode (hereinafter, also referred to as a "light receiving surface electrode"). Particularly when the surface electrode is formed, a conductive paste that contains a mixture of conductive particle mainly containing a metal such as silver, glass frit, an organic vehicle, and an additive that is added as needed, is used to form an electrode by screen printing, stencil printing, or the like.

As an example illustrated in FIG. 1, a diffusion layer 3 is formed on a surface (a light receiving surface) of a p-type crystalline silicon substrate 4 that has an uneven shape, which is generally called a texture structure, in a crystalline silicon solar cell. The diffusion layer 3 is formed by diffusing impurities such as phosphorus (P) on the light receiving surface of the semiconductor substrate 4, and this layer is a region having a conductivity type opposite to that of the semiconductor substrate 4, which is described as an n-type. The n-type diffusion layer 3 is formed by, for example, disposing the semiconductor substrate 4 in a diffusion furnace and heating it in phosphorus oxychloride ($POCl_3$) or the like. On the diffusion layer 3, an insulating antireflection film 2 made of silicon nitride, silicon oxide, titanium oxide, or the like is formed for protection of the solar cell element, as well as for the antireflection function. For example, when silicon nitride (hereinafter, referred to as "SiN") is used, the film is formed by a plasma CVD method using a mixed gas of silane ($SiH_4$) and ammonia ($NH_3$). The antireflection film 2 is formed for example, to have a refractive index of about 1.8 to 2.3 and a thickness of about 5 to 100 nm considering a refractive index difference from the semiconductor substrate 4.

Then, the surface electrode 1 is formed on the antireflection film 2 by printing and applying the above-mentioned conductive paste in a grid shape using a screen printing method or the like, and firing at a temperature of about 500 to 900° C. In firing, the antireflection film 2 is usually dissolved and removed by an effect of the glass frit contained in the conductive paste to achieve an electrical contact between the surface electrode 1 and the n-type diffusion layer 3. This process is generally referred to as fire through.

On the other hand, a back electrode 5 and, for example, a high-concentration p-type BSF layer with aluminum or the like diffused are formed on the back side of the semiconductor substrate 4.

For better fire through, glass having good solubility with the antireflection film 2 is desirably used as the glass frit in the conductive paste. Conventionally, glass containing a lead oxide has been often used as glass frit contained in a conductive paste for forming a surface electrode because glass has an easy-to-adjust softening point, has a good adhesion to the substrate (adhesion strength), allows relatively good fire through, and provides a solar cell with excellent electric characteristics.

For example, lead borosilicate-based glass frit is used for a silver paste for forming a solar cell electrode described in Patent Literature 1, Patent Literature 2, and Patent Literature 4, and lead borate-based glass frit as well as lead borosilicate-based glass frit is described in Patent Literature 3.

In firing the surface electrode 1 during the fire through described above, the surface electrode 1 does not penetrate the antireflection film 2 for example due to a variation in the effect of the glass frit, which causes several problems such as no stable ohmic contact provided between the surface electrode 1 and the n-type diffusion layer 3 formed on the surface of the semiconductor substrate 4 and a variation in bonding strength. Insufficient ohmic contact causes several problems such as loss in output, a decrease in the conversion efficiency of the solar cell, and deterioration of current-voltage characteristics.

On the other hand, there is a known problem that the voltage characteristics are deteriorated when a fire through process is excessive as described in Paragraph 0004 in Patent Literature 4 and Paragraph 0017 in Patent Literature 5. As described above, the thickness of the antireflection film 2 is as small as about 5 to 100 nm; therefore, if the surface electrode 1 penetrates the antireflection film 2 and further the underlying n-type diffusion layer 3 and erodes the inside of the semiconductor substrate 4, the pn junction can be disconnected, which may adversely affect the fill factor (hereinafter referred to as "FF") obtained from the measurement of the current-voltage characteristics. In the case where the thickness of the n-type diffusion layer 3 is further reduced for a higher efficiency, the layer is more likely to be penetrated, thus the controlling of these characteristics becomes more difficult.

FIG. 2 illustrates an interface between the surface electrode of a commercially available solar cell substrate and the semiconductor substrate, which is observed by a transmission electron microscope (TEM). This commercial solar cell uses lead-based glass in the surface electrode. FIG. 2 illustrates a lead-based glass layer 6 deposited between the surface electrode 1 and the SiN layer 2 serving as an antireflection film and containing a silver component in the conductive paste, a part 7 of the glass layer 6 seems to penetrate the SiN layer 2 and come into contact with the silicon substrate 4 (or the n-type diffusion layer 3), and in a part 8 of the layer, excessive fire through causes deep erosion into the semiconductor substrate 4 in a protruding manner.

Recently, switching to solar cells with lead-free materials/parts has been desired because of increasing environmental awareness. Conventionally, like lead-based glass, alternative materials/parts have been developed to prepare solar cells that allow easy adjusting of the softening point of glass, have a good adhesion to the substrate (adhesion strength), make relatively good fire through, and have excellent electric characteristics.

As an example, a surface electrode has been formed using zinc borosilicate-based glass frit described in Patent Literature 3, bismuth borosilicate-based and zinc borosilicate-based glass frit described in Patent Literature 4, bismuth silicate-based glass frit described in Patent Literature 6, and zinc borate-based glass frit described in Patent Literature 7. However, the study by the inventors of the present invention has revealed that control of the fire through process is difficult even when the lead-free glass is used because the fire through process is insufficient, no ohmic contact is obtained, or, as with the case of FIG. 2, an excessive fire through process causes deep eroding of the surface electrode in part to a semiconductor substrate.

In particular, in recent years, a technique using tellurium-based glass for forming electrodes of a solar cell has been focused. For example, it is disclosed that tellurium-based glass containing 25 to 90 mol % of tellurium oxide is mixed in a conductive paste and this paste is used to form an electrode of a solar cell in Patent Literature 8 filed by the applicant of the present application. Various types of tellurium-based glass are examined in Patent Literature 8, and it is demonstrated that all the types of tellurium-based glass examined successfully provide a sufficient ohmic contact while the fire through process is controlled.

Furthermore, it is disclosed that a combination of conductive powder having a specific surface area of 0.4 m²/g or more and containing silver as a main component and glass frit containing tellurium-tungsten-zinc-boron and/or zirconium can produce electrodes with a higher adhesion strength to solar cell substrates and particularly excellent electrical properties in Patent Literature 9 filed by the applicant of the present application.

CITATION LIST

Patent Literature

Patent Literature 1: Japanese Patent Application Laid-open No. 11-213754
Patent Literature 2: Japanese Patent Application Laid-open No. 2001-093326
Patent Literature 3: Japanese Patent Application Laid-open No. 2001-118425
Patent Literature 4: Japanese Patent Application Laid-open No. 10-326522
Patent Literature 5: Japanese Patent Application Laid-open No. 2004-207493
Patent Literature 6: Japanese Translation of PCT International Application Publication No. 2008-543080
Patent Literature 7: Japanese Patent Application Laid-open No. 2009-194121
Patent Literature 8: Japanese Patent Application Laid-open No. 2011-96747
Patent Literature 9: WO2016/147867

SUMMARY

Technical Problems

As described in Patent Literature 9, the conductive paste for forming a solar cell electrode using glass frit containing tellurium-tungsten-zinc-boron and/or zirconium has a wide process window for firing temperature; therefore, the conductive paste can provide better electric characteristics at a firing peak temperature of, for example, between 750° C. and 850° C.

Experiments and research conducted by the inventors of the present invention have revealed that, as described below, for the conductive paste for forming a solar cell electrode described in Patent Literature 9, the firing peak temperature of 780° C. or higher results in stable and better electric characteristics, and the temperature of below 780° C. (for example, 760° C.) may result in stable and better electric characteristics, but in some cases, may result in poor characteristics, thus a variation in characteristics is easily caused.

Table 1 lists reference examples in which FF was measured for electrodes obtained by preparing a conductive paste in the same manner as in the experimental examples described below except that the glass frit used was composed of 39.6 mol % of tellurium, 24.1 mol % of tungsten, 21.8 mol % of zinc, 8.5 mol % of boron, 4.3 mol % of zirconium, and 1.7 mol % of aluminum in terms of oxide, then printing/drying the paste on a substrate while changing only the firing peak temperature to 800° C., 780° C., and 760° C.

TABLE 1

| Sample name | Fill factor FF Measurement | | | Fill factor | Variation |
| --- | --- | --- | --- | --- | --- |
| | #1 | #2 | #3 | FF Average | [%] |
| Reference 1 (Fired 800° C.) | 0.8013 | 0.7949 | 0.8027 | 0.7996 | 0.59 |
| Reference 2 (Fired 780° C.) | 0.7968 | 0.7806 | 0.7898 | 0.7891 | 1.07 |
| Reference 3 (Fired 760° C.) | 0.7530 | 0.6625 | 0.6548 | 0.6901 | 9.11 |

As clearly indicated in Table 1, when the glass frit having these compositions is used, the FF value may be high with a small variation at the firing peak temperature of 800° C. and 780° C., and the FF value may be high or low, i.e., the value has a large variation at the temperature of 760° C. The reason for this remains unclear; however, it is presumed that the non-uniformity of the environmental conditions such as the temperature in a firing furnace due to the lowered firing peak temperature may have a greater effect on the above characteristics.

Such variations can be eliminated by adding an additive to the conductive paste or by strictly controlling the firing conditions. However, it is desirable to avoid as much as possible the addition of additives that may affect other characteristics of solar cells and stricter or more complicated of manufacturing conditions which can be a negative factor in industrial/commercial mass production.

In view of the foregoing, an object of the present invention is to provide a conductive paste for forming a solar cell electrode with better electric characteristics and a small variation in the characteristics even at a relatively low firing temperature (for example, 760° C.).

Solution to Problems

The problems described above are solved by the present invention as described below.

Specifically, the present invention (1) provides a conductive paste for forming a solar cell electrode including conductive powder (I), glass frit (II), and an organic vehicle (III).

At least a glass frit component (A) is contained as the glass frit (II).

The glass frit component (A) contains the following as essential components in a content ratio to a total molar number in terms of oxide:
(a) 30 to 70 mol % of tellurium element in terms of $TeO_2$,
(b) 18 to 30 mol % of tungsten element in terms of $WO_3$,
(c) 5 to 30 mol % of zinc element in terms of ZnO,
(d) 1 to 15 mol % of boron element in terms of $B_2O_3$,
(e) 0.3 to 5 mol % of aluminum element in terms of $Al_2O_3$,
(f) 0.3 to 7 mol % of one selected from rare earth elements other than scandium and promethium in terms of oxide, or 0.3 to 7 mol % of each of two or more selected from rare earth elements other than scandium and promethium in terms of oxide and 10 mol % or less in total, and
(g) 0.1 to 7 mol % of one selected from the group consisting of tin, lithium, and barium elements in terms of $SnO_2$, $Li_2O$, or BaO, or 0.1 to 7 mol % of each of two or more selected from the group consisting of tin, lithium, and barium elements in terms of $SnO_2$, $Li_2O$, or BaO and 10 mol % or less in total.

The present invention (2) provides the conductive paste for forming a solar cell electrode according to (1), in which the rare earth element (f) is one or more selected from the group consisting of yttrium, lanthanum, cerium, proseodymium, neodymium, samarium, gadolinium, dysprosium, erbium, and ytterbium.

The present invention (3) provides the conductive paste for forming a solar cell electrode according to (1) or (2), in which the glass frit (A) is made of a substantially lead-free glass frit component.

The present invention (4) provides the conductive paste for forming a solar cell electrode according to any of (1) to (3), in which the glass frit component (A) contains the following as essential components in the content ratio to the total molar number in terms of oxide:
(a) 30 to 50 mol % of tellurium element in terms of $TeO_2$,
(b) 18 to 27 mol % of tungsten element in terms of $WO_3$,
(c) 10 to 25 mol % of zinc element in terms of ZnO,
(d) 5 to 15 mol % of boron element in terms of $B_2O_3$,
(e) 0.3 to 3 mol % of aluminum element in terms of $Al_2O_3$,
(f) 0.5 to 7 mol % of one selected from rare earth elements other than scandium and promethium in terms of oxide, or 0.5 to 7 mol % of each of two or more selected from rare earth elements other than scandium and promethium in terms of oxide and 10 mol % or less in total, and
(g) 0.3 to 7 mol % of one selected from the group consisting of tin, lithium, and barium elements in terms of $SnO_2$, $Li_2O$, or BaO, or 0.3 to 7 mol % of each of two or more selected from the group consisting of tin, lithium, and barium elements in terms of $SnO_2$, $Li_2O$, or BaO and 10 mol % or less in total.

The present invention (5) provides the conductive paste for forming a solar cell electrode according to any one of (1) to (4), in which the conductive powder (I) is metal powder containing silver.

The present invention (6) provides the conductive paste for forming a solar cell electrode according to any one of (1) to (5), in which the amount of the glass frit (A) is 0.1 to 10 parts by weight based on 100 parts by weight of the conductive powder (I).

Advantageous Effects of Invention

The present invention can provide a conductive paste for forming a solar cell electrode with better electric characteristics and a small variation in the characteristics even at a relatively low firing temperature (for example, 760° C.).

DESCRIPTION OF EMBODIMENTS

Figure 1:
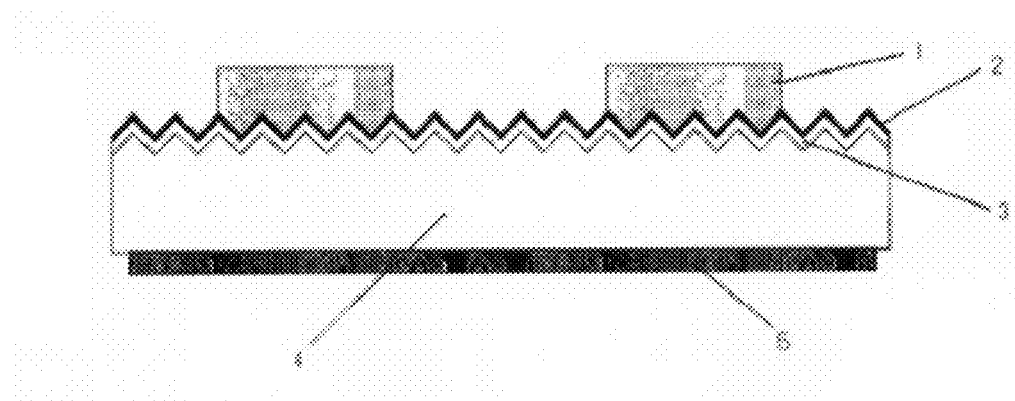
FIG. 1 is a schematic diagram of a solar cell element.

Although one embodiment of a conductive paste and a solar cell element according to the present invention will be described below, the scope of the present invention is not limited to the following description.

In the following, the term "to" indicating a numerical range refers to a range including the numerical values described before and after the term "to" unless otherwise specified. That is, the phrase "A to B" represents not less than A and not more than B.

In the present invention, the phrase "substantially lead-free" includes an aspect containing no lead component as well as an aspect containing a small amount of lead as an unavoidable impurity (for example, 1000 ppm or less).

Furthermore, a "main component" refers to a component contained in an object at 51% by mass or more.

In the present invention, an element (f) does not include scandium or promethium, and includes, in particular, one or more elements selected from the group consisting of yttrium, lanthanum, cerium, praseodymium, neodymium, samarium, europium, gadolinium, terbium, dysprosium, holmium, erbium, thulium, ytterbium, and lutetium.

The conductive paste for forming a solar cell electrode according to the present invention is obtained by dispersing at least conductive powder (I) and glass frit (II) in an organic vehicle. The conductive paste for forming a solar cell electrode according to the present invention is suitably used for forming a surface (light receiving surface) electrode of a solar cell, specifically, the conductive paste for forming a solar cell electrode according to the present invention is printed and fired on an antireflection film such as silicon nitride or silicon oxide on the surface of a solar cell to obtain an electrode exhibiting excellent solar cell characteristics.

The conductive powder (I) in the conductive paste for forming a solar cell electrode according to the present invention is preferably metal powder containing silver, and more preferably silver-based conductive powder containing silver as a main component. The specific surface area of the conductive powder (I) measured by the BET method is not particularly limited to, but is preferably 0.4 $m^2/g$ or more. The upper limit of the specific surface area of the conductive powder (I) is not defined; however, the conductive powder (I) is easily fired even at a low temperature due to an excessive area, which makes it difficult to coordinate with the firing timing of other components (glass, organic vehicle, etc.) contained in the paste. Therefore, the specific surface area of the conductive powder (I) is preferably 1.0 $m^2/g$ or less.

Examples of the shape of the conductive powder (I) include those conventionally used, such as a sphere, a flake, and a tree. The conductive powder (I) includes pure silver powder, silver-coated composite powder having at least a silver layer on a surface, an alloy containing silver as a main component, and the like. The conductive powder (I) may be a combination of two or more types of silver powder having different average particle diameters, particle size distributions, shapes, and the like, or may be a combination of silver powder and conductive powder other than silver. Examples of metals that form a composite with silver powder or an alloy with silver or that are mixed with silver powder include, but are not limited to, aluminum, gold, palladium, copper, and nickel unless the advantageous effects of the present invention are impaired. In light of conductivity, the conductive powder (I) is preferably pure silver powder.

The glass frit (II) in the conductive paste for forming a solar cell electrode according to the present invention contains one or more glass frit components. The conductive paste for forming a solar cell electrode according to the present invention contains at least a glass frit component (A) as the glass frit (II). That is, the conductive paste for forming a solar cell electrode according to the present invention may contain only the glass frit component (A) as the glass frit (II). Alternatively, the glass frit (II) may contain a glass frit component (A) and one or more glass frit components other than the glass frit component (A).

The glass frit component (A) contains the following as essential components in the content ratio to the total molar number in terms of oxide:
(a) 30 to 70 mol % of tellurium element in terms of $TeO_2$,
(b) 18 to 30 mol % of tungsten element in terms of $WO_3$,
(c) 5 to 30 mol % of zinc element in terms of ZnO,
(d) 1 to 15 mol % of boron element in terms of $B_2P_3$,
(e) 0.3 to 5 mol % of aluminum element in terms of $Al_2O_3$,
(f) 0.3 to 7 mol % of one selected from rare earth elements other than scandium and promethium in terms of oxide, or 0.3 to 7 mol % of each of two or more selected from rare earth elements other than scandium and promethium in terms of oxide and 10 mol % or less in total, and
(g) 0.1 to 7 mol % of one selected from the group consisting of tin, lithium, and barium elements in terms of $SnO_2$, $Li_2O$, or BaO, or 0.1 to 7 mol % of each of two or more selected from the group consisting of tin, lithium, and barium elements in terms of $SnO_2$, $Li_2O$, or BaO and 10 mol % or less in total.

The glass frit component (A) contains the elements (a), (b), (c), (d), (e), (f), and (g) as essential components. The content ratio of the elements (a) to (g) in the glass frit component (A) is a ratio of the elements contained in the glass frit component (A) in terms of the oxides described above and the content ratio with respect to the total molar number of the elements (a) to (g) in terms of the oxides described above. That is, the content ratio of the elements (a) to (g) is determined with the total of the elements (a) to (g) in terms of the oxides described above being 100 mol %.

Figure 2:
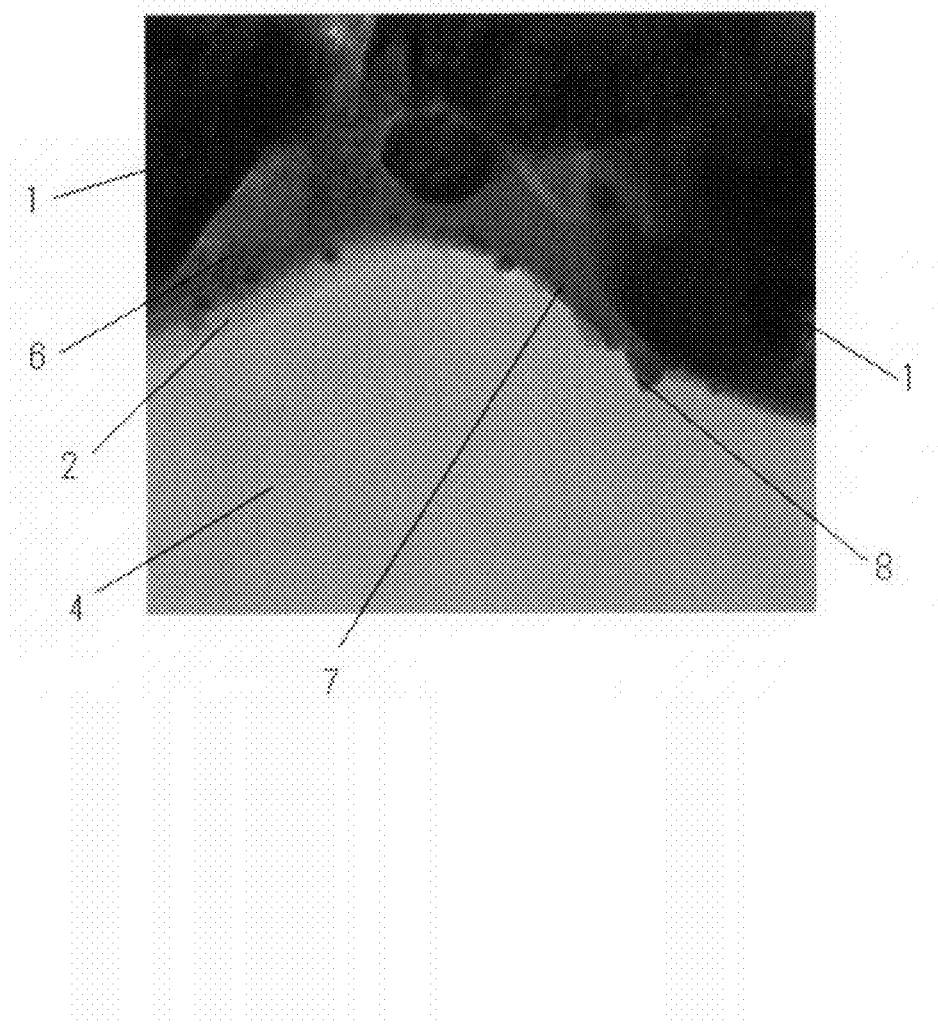
FIG. 2 is a TEM photograph of an interface between a surface electrode using conventional lead-based glass and a substrate.

The glass frit component (A) contains 30 to 70 mol %, preferably 30 to 50 mol %, and particularly preferably 35 to 45 mol % of (a) tellurium element in terms of $TeO_2$ based on the total molar number of the elements (a) to (g) in terms of oxide. Tellurium is a network-forming component that does not vitrify by itself, but forms a main structure of glass. When a conductive paste containing a tellurium-based glass frit component is used for forming a surface electrode of a solar cell, a deep erosion into the semiconductor substrate hardly occurs on the surface electrode as described with reference to FIG. 2, and the fire through process is easily controlled, and a sufficient ohmic contact can be provided. That is, since the tellurium-based glass frit component has a characteristic of low reactivity with silicon, even if the surface electrode penetrates the antireflection film, it does not evade deeply into the silicon substrate. Therefore, the conductive paste for forming a solar cell electrode according to the present invention allows easier control of the fire through process than the conventional conductive paste for forming a solar cell electrode does, and thus allows a further reduction in the thickness of the solar cell, and thus a further reduction in the thickness of the n-type diffusion layer.

The glass frit component (A) contains tungsten as a component other than tellurium to support the formation of a glass network. Tungsten in the tellurium-based glass fit component contributes to expansion and stabilization of the vitrification range. The glass frit component (A) contains 18 to 30 mol %, preferably 18 to 27 mol %, and particularly preferably 19 to 25 mol % of (b) tungsten element in terms of WO3 based on the total molar number of the elements (a) to (g) in terms of oxide.

Zinc contributes to expansion and stabilization of the vitrification range. The glass frit component (A) contains 5 to 30 mol %, preferably 10 to 25 mol %, and particularly preferably 15 to 23 mol % of (c) zinc element in terms of ZnO based on the total molar number of the elements (a) to (g) in terms of oxide.

Boron is assumed to contribute to an increase in adhesion strength by controlling the fluidity of glass and reacting appropriately with the antireflection film on the substrate. The glass frit component (A) contains 1 to 15 mol %, preferably 5 to 15 mol %, and particularly preferably 7 to 13 mol % of (d) boron element in terms of $B_2O_3$ based on the total molar number of the elements (a) to (g) in terms of oxide.

The glass frit component (A) contains 0.3 to 5 mol %, preferably 0.3 to 3 mol %, and particularly preferably 0.5 to 3 mol % of (e) aluminum element in terms of $Al_2O_3$ based on the total molar number of the elements (a) to (g) in terms of oxide.

The glass frit component (A) contains 0.3 to 7 mol %, preferably 0.5 to 7 mol %, and particularly preferably 0.8 to 7 mol % in terms of oxide of (f) one selected from rare earth elements other than scandium and promethium in terms of oxide based on the total molar number of the elements (a) to (g) in terms of oxide or contains 0.3 to 7 mol %, preferably 0.5 to 7 mol %, and particularly preferably 0.8 to 7 mol % and 10 mol % or less in total of (f) two or more selected from rare earth elements other than scandium and promethium in terms of oxide based on the total molar number of the elements (a) to (g) in terms of oxide. That is, the glass frit component (A) contains (i) one selected from (f) rare earth elements, or (ii) two or more selected from (f) rare earth elements. (i) When the glass frit component (A) contains one selected from (f) rare earth elements, the content ratio of the (f) rare earth element is 0.3 to 7 mol %, preferably 0.5 to 7 mol %, and particularly preferably 0.8 to 7 mol % in terms of oxide based on the total molar number of the elements (a) to (g) in terms of oxide. (ii) When the glass frit component (A) contains two or more selected from (f) rare earth elements, the content ratio of the (f) rare earth element is 0.3 to 7 mol %, preferably 0.5 to 7 mol %, and particularly preferably 0.8 to 7 mol % in terms of oxide based on the total molar number of the elements (a) to (g) in terms of oxide, and the total content of these (f) two or more rare earth elements is 10 mol % or less. The content of each element refers to a value obtained by converting yttrium to $Y_2O_3$, lanthanum to $La_2O_3$, cerium to $Ce_2O_4$, praseodymium to $Pr_2O_{11/3}$, neodymium to $Nd_2O_3$, samarium to $Sm_2O_3$, gadolinium to $Gd_2O_3$, dysprosium to $Dy_2O_3$, erbium to $Er_2O_3$, and ytterbium to $Yb_2O_3$. The stable form of cerium oxide is $CeO_2$; however, when the molar number is calculated in terms of oxide here, it is calculated as $Ce_2O_4$ to treat it in the same manner as the other rare earth elements. The stable form of praseodymium oxide is $Pr_6O_{11}$; however, when the molar number is calculated in terms of oxide here, it is calculated as $Pr_2O_{11/3}$ to treat it in the same manner as the other rare earth elements.

In the present invention, the rare earth element (f) is preferably one or more selected from the group consisting of yttrium, lanthanum, cerium, praseodymium, neodymium, samarium, gadolinium, dysprosium, erbium, and ytterbium.

The glass frit component (A) contains 0.1 to 7 mol %, preferably 0.3 to 6 mol %, and particularly preferably 0.5 to 6 mol % of one selected from the group consisting of (g) tin, lithium, and barium elements in terms of $SnO_2$, $Li_2O$, or BaO, respectively, based on the total molar number of the elements (a) to (g) in terms of oxide, or contains 0.1 to 7 mol %, preferably 0.3 to 6 mol %, and particularly preferably 0.5 to 6 mol % and 10 mol % or less in total of two or more selected from (g) tin, lithium, and barium elements in terms of $SnO_2$, $Li_2O$, or BaO, respectively, based on the total molar number of the elements (a) to (g) in terms of oxide. In other words, the glass frit component (A) contains (i) (g) one selected from the group consisting of tin, lithium, and barium elements or (ii) (g) two or more selected from the group consisting of tin, lithium, and barium elements. (i) When the glass frit component (A) contains (g) one selected from the group consisting of tin, lithium, and barium elements, the content ratio of the element (g) is 0.1 to 7 mol %, preferably 0.3 to 6 mol %, and particularly preferably 0.5 to 6 mol % in terms of $SnO_2$, $Li_2O$, or BaO, respectively, based on the total molar number of the elements (a) to (g) in terms of oxide. (ii) When the glass frit component (A) contains (g) two or more selected from the group consisting of tin, lithium, and barium elements, the content ratio of each element (g) is from 0.1 to 7 mol %, preferably from 0.3 to 6 mol %, and particularly preferably 0.5 to 6 mol % in terms of $SnO_2$, $Li_2O$, or BaO, respectively, based on the total molar number of the elements (a) to (g) in terms of oxide, and the total content of these (g) two or more elements is 10 mol % or less.

The content ratio of the elements (a) to (g) is a content ratio of the inner percentage to the total of the elements (a) to (g).

The conductive paste for forming a solar cell electrode according to the present invention contains the glass frit component (A) as glass frit (II) in which the glass frit component (A) contains (a) tellurium, (b) tungsten, (c) zinc, and (d) boron and further (e) aluminum and (f) one or more rare earth elements, and (g) one or more selected from the group consisting of tin, lithium, and barium as essential components, whereby a solar cell electrode with high electric characteristics and a small variation in characteristics can be obtained even at a low firing temperature (for example, 760° C. or lower).

The inventors of the present invention have found that (1) crystals containing tungsten and zinc may be precipitated depending on environmental conditions such as firing conditions when a conductive paste containing a tellurium-based glass frit component is fired; (2) in such a case, the viscous behavior of glass becomes unstable, and thus the adhesion strength to the substrate also adversely affects the electric characteristics of the solar cell; (3) tellurium, tungsten, zinc, and boron, and further, aluminum and one or more rare earth elements, one or more selected from the group consisting of tin, lithium, and barium are contained together, thus the above-mentioned precipitation of crystals is suppressed to stabilize the viscous behavior and to have a good effect on the electric characteristics such as the fill factor of the finally obtained solar cell.

Accordingly, using the conductive paste for forming a solar cell electrode according to the present invention not only at a high conventional firing peak temperature but also at a relatively lower firing peak temperature (for example, around 760° C.) can provide excellent electric characteristics and a small variation in the electric characteristics.

Such effects cannot be obtained when using a glass frit component containing tellurium, tungsten, zinc, and boron together with aluminum only, a glass frit component containing only rare earth elements, or a glass frit component containing only one or more of tin, lithium, and barium.

The glass frit component (A) may further contain, for example, silver, zirconium, titanium, phosphorus, and tantalum other than the elements (a), (b), (c), (d), (e), (f), and (g) when needed, to adjust the reactivity with the antireflection film and the amount of silver to be dissolved. Such a glass frit component (A) is preferably substantially free from lead components, and specifically, the amount of lead contained in the glass frit component (A) is preferably 1000 ppm or less.

When the glass frit component (A) contains an element other than the elements (a) to (g), the content ratio of the elements other than the elements (a) to (g) is 15 mol % or less and preferably 10 mol % or less, in terms of oxide, based on the total molar number of the elements (a) to (g) in terms of oxide. The content ratio of the elements other than the elements (a) to (g) is the content ratio of the outer percentage to the total of the elements (a) to (g).

The average particle size of the glass frit component (A) is preferably 0.5 to 5.0 μm. The softening point of the glass frit component (A) is preferably from 300 to 550° C.

The conductive paste for forming a solar cell electrode according to the present invention may contain a glass frit component other than the glass frit component (A) as glass frit (II) when needed, to control the firing temperature, the reactivity to the antireflection film, and the like. The glass frit components other than the glass frit component (A) include known glass frit components such as $SiO_2$—$B_2O_3$-based, $SiO_2$—$B_2O_3$—ZnO-based, $SiO_2$—$Bi_2O_3$-based, or $B_2O_3$—ZnO-based components, and are preferably $SiO_2$—$B_2O_3$-based and $SiO_2$—$B_2O_3$—ZnO-based glass frit components.

The softening point of the glass frit (II) is preferably from 300 to 550° C. When the glass frit (II) contains two or more glass frit components, the softening point of the glass frit (II) refers to the softening point of a mixture of these two or more glass frit components. The average particle size of the glass frit (II) is preferably 0.5 to 5.0 μm. When the glass frit (II) contains two or more glass frit components, the average particle size of the glass frit (II) refers to the average particle size of a mixture of these two or more glass frit components.

The content of the glass frit (II) in the conductive paste for forming a solar cell electrode according to the present invention is not particularly limited as long as it is an amount that typically contained in the conductive paste for forming a solar cell electrode. As an example, the content of the glass frit (II) is preferably 0.1 to 10 parts by weight and particularly preferably 0.1 to 5 parts by weight with respect to 100 parts by weight of the conductive particle (I).

When the conductive paste for forming a solar cell electrode according to the present invention contains a glass frit component (A) and a glass frit component other than the glass frit component (A) as glass frit (II), the content of the glass frit component (A) with respect to the glass frit (II) is preferably 70% by weight or more, and particularly preferably 80% by weight or more, and more preferably 90% by weight or more.

The conventional conductive paste for forming a solar cell electrode needs to be formulated with a certain amount of the glass frit for better fire through; however, the conductive paste for forming a solar cell electrode according to the present invention can provide a sufficient ohmic contact even when the amount of the glass frit formulated is reduced, thus a highly conductive electrode can be obtained.

Preferably, such a conductive paste for forming a solar cell electrode according to the present invention is substantially free from lead components, and specifically, the amount of lead contained in the conductive paste for forming a solar cell electrode is preferably 1000 ppm or less.

The conductive paste for forming a solar cell electrode according to the present invention may further include, as needed, a plasticizer, a viscosity modifier, a surfactant, an oxidizing agent, a metal oxide, metal organic compounds, and the like, which may be typically added as additives, in a range that does not impair the advantageous effects of the present invention.

The conductive paste for forming a solar cell electrode according to the present invention may contain a silver compound such as silver carbonate, silver oxide, or silver acetate, which are described in Japanese Patent Application Laid-open No. 2007-242912. In addition, copper oxide, zinc oxide, titanium oxide, and the like may be contained as appropriate to improve the firing temperature, solar cell characteristics, and the like.

The conductive paste for forming a solar cell electrode according to the present invention is mixed with an organic vehicle (III) as well as the conductive powder (I), the glass frit (II), and additives that are added as appropriate when needed, and then the mixture is made into a paste, paint, or ink having a suitable rheology for screen printing or other printing methods.

The organic vehicle (III) in the conductive paste for forming a solar cell electrode according to the present invention is not particularly limited, and selected as appropriate from an organic binder, a solvent, or the like that are typically used as a vehicle of a conductive paste. Examples of the organic binder include celluloses, acrylic resins, phenol resins, alkyd resins, rosin esters, and the like. Examples of the solvent include organic solvents such as alcohols, ethers, esters, and hydrocarbons, and water, and mixed solvents of these. The amount of the organic vehicle (III) contained in the conductive paste for forming a solar cell electrode according to the present invention is not particularly limited and is adjusted as appropriate depending on the coating method and the like such that the inorganic components, such as the conductive powder (I) and the glass frit (II), can be held in the paste. Typically, the amount of the organic vehicle (III) contained in the conductive paste for forming a solar cell electrode according to the present invention is about 5 to 40 parts by weight based on 100 parts by weight of the conductive powder (I).

As an example, a solar cell element, to which the conductive paste for forming a solar cell electrode according to the present invention is applied, is manufactured as follows. A semiconductor substrate for the solar cell element is preferably made of monocrystalline silicon or polycrystalline silicon, and has one conductivity type (for example, p-type) by containing boron or the like, for example. Forming a diffusion layer on a light receiving surface of the semiconductor substrate by diffusing phosphorus atoms and the like results in the forming of a region exhibiting the opposite conductivity type (for example, n-type). Further on this region, an antireflection film made of silicon nitride, silicon oxide, or the like can be formed. An aluminum paste and a silver paste or a silver-aluminum paste is applied and dried on a surface of the substrate opposite to the light receiving surface to form a back electrode and a high-concentration p-type BSF layer. The conductive paste for forming a solar electric electrode according to the present invention is applied on the antireflection film by a typical method such as a screen printing method and is then dried. After that, the substrate is fired under conditions with a peak temperature of 500 to 900° C. and a total firing time from several tens of seconds to several tens of minutes to decompose and volatilize organic vehicle components and form a surface electrode, a back electrode, and a BSF layer simultaneously.

The surface electrode and the back electrode do not always need to be formed simultaneously. The surface electrode may be formed after the back electrode is fired, or the back electrode may be formed after the surface electrode is formed.

Furthermore, to achieve high photoelectric conversion efficiency, the light receiving surface of the semiconductor substrate preferably has an uneven (or pyramid) texture structure.

According to the present invention, not only when the firing temperature is as high as the conventional peak temperature, but also when the peak temperature is around 760° C. or lower, and the total firing time is short (for example, about 30 seconds to 5 minutes), a solar cell electrode having excellent electric characteristics can be obtained, and thus the advantageous effects of the present invention can be particularly achieved.

Hereinafter, the present invention will be described based on specific experimental examples, but the present invention is not limited thereto.

EXAMPLES

Based on 100 parts by weight of silver powder having a specific surface area of 0.60 m$^2$/g, which was measured by the BET method, 2.0 parts by weight of glass frit having an average particle size of 1 to 2 µm, whose compositions are presented in Table 2, was dispersed in an organic vehicle containing 0.5 parts by weight of ethyl cellulose and 6.0 parts by weight of a glycol-based solvent to prepare a conductive paste for forming a solar cell electrode (samples 1 to 46). Note that samples with symbol * indicated on the sample numbers are comparative examples in Tables 2 and 3. Each component of the glass composition is presented in mol % based on the total molar number in terms of oxides of the elements (a) to (g) (the total of the elements (a) to (g) in terms of oxides is 100 mol %).

Substantially square silicon substrates (commercially available) of 156.75 mm×156.75 mm in the number of the above samples was prepared by diffusing phosphorus on a p-type silicon substrate having a pyramid-type texture structure on its light receiving surface, adjusting the sheet resistance value from 95 to 115 Ω/sq., and forming a SiN layer. A plurality of thin line-shaped surface electrodes having a width of 50 µm and a thickness of 20 µm were formed at a pitch of 1.6 mm using each sample on the prepared semiconductor substrates, and further an aluminum paste (commercially available) was applied to the back surface of the semiconductor substrates and was dried. Then, these semiconductor substrates were simultaneously fired in a total firing time of 50 seconds at a peak temperature of 760° C. to obtain semiconductor substrates corresponding to samples 1 to 46.

I-V characteristics of the obtained semiconductor substrates were determined under the conditions of an atmospheric temperature (cell temperature) of 25° C., spectral distribution of AM1.5, and a radiation intensity of 1000 W/m$^2$, using a Solar simulator (WXS-1565-10, SP, AM1.5G), an I-V measuring device (IV15040), and a temperature controllable sample stage (STG-250VPZ) (all made by Wacom Denso Co., Japan). The I-V characteristics were used to calculate FF values.

FF values were calculated three times at different measurement points on the semiconductor substrates. Table 3 lists average FF values. Furthermore, numerical values of "((maximum value−average value)/average value)×100" and "((average value−minimum value)/average value)×100" were determined, and the larger value is expressed as "Variation" and presented in Table 3.

As listed in Tables 2 and 3, the samples containing a glass frit component (A), which is in a composition range defined for the conductive paste for forming a solar cell electrode according to the present invention, provide excellent electric characteristics with a small variation even at a firing peak temperature of 760° C.

TABLE 2

| Sample name | Glass composition of glass frit [mol %] | | | | | | | | | | |
|---|---|---|---|---|---|---|---|---|---|---|---|
| | $TeO_2$ | $WO_3$ | ZnO | $B_2O_3$ | $Al_2O_3$ | $Y_2O_3$ | $La_2O_3$ | $Pr_2O_{11/3}$ | $Nd_2O_3$ | $Sm_2O_3$ | $Gd_2O_3$ |
| * Sample 1 | 41.3 | 25.1 | 22.8 | 8.9 | 1.8 | | | | | | |
| * Sample 2 | 38.6 | 23.5 | 21.3 | 8.3 | | 4.2 | | | | | |
| * Sample 3 | 36.5 | 22.2 | 20.1 | 7.9 | 1.6 | | 7.9 | | | | |
| * Sample 4 | 36.5 | 22.2 | 20.1 | 7.9 | 1.6 | | | | 3.9 | | |
| * Sample 5 | 32.8 | 16.4 | 32.8 | 8.2 | 1.7 | 4.1 | | | | | |
| * Sample 6 | 41.3 | 25.1 | 22.8 | 8.9 | 1.8 | | | | | | |
| * Sample 7 | 39.6 | 24.1 | 21.8 | 8.5 | 1.7 | | | | | | |
| * Sample 8 | 36.5 | 22.2 | 20.1 | 7.9 | 1.6 | | | | 7.9 | | |
| * Sample 9 | 39.6 | 24.1 | 21.8 | 8.5 | 1.7 | 4.3 | | | | | |
| * Sample 10 | 39.6 | 24.1 | 21.8 | 8.5 | 1.7 | 4.3 | | | | | |
| * Sample 11 | 38.9 | 23.7 | 21.5 | 10.1 | 1.7 | 4.2 | | | | | |
| * Sample 12 | 39.5 | 24.0 | 21.8 | 8.5 | 1.8 | 4.3 | | | | | |
| Sample 13 | 38.6 | 23.5 | 21.3 | 8.3 | 1.7 | | 2.5 | | | | |
| Sample 14 | 39.2 | 23.9 | 21.7 | 8.5 | 1.7 | | | 0.8 | | | |
| Sample 15 | 38.6 | 23.5 | 21.3 | 8.3 | 1.7 | | | | | | |
| * Sample 16 | 38.0 | 23.1 | 20.9 | 12.3 | 1.6 | 4.1 | | | | | |
| Sample 17 | 37.3 | 22.7 | 20.6 | 8.1 | 1.6 | | 4.0 | | | | |
| Sample 18 | 38.6 | 23.5 | 21.3 | 8.3 | 1.7 | | | | | | |
| Sample 19 | 38.0 | 23.1 | 20.9 | 8.2 | 1.6 | | | | 4.1 | | |
| Sample 20 | 38.0 | 23.1 | 20.9 | 8.2 | 1.6 | | | | 5.7 | | |
| Sample 21 | 37.3 | 22.7 | 20.6 | 8.1 | 1.6 | | | | 4.0 | | |
| Sample 22 | 36.5 | 22.2 | 20.1 | 11.8 | 1.6 | 3.9 | | | | | |
| Sample 23 | 38.0 | 23.1 | 20.9 | 8.2 | 1.6 | | 4.1 | | | | |
| Sample 24 | 37.9 | 23.1 | 20.9 | 8.2 | 1.7 | | | | | | 4.1 |
| Sample 25 | 38.6 | 23.5 | 21.3 | 8.3 | 1.7 | | | | | | |
| Sample 26 | 41.0 | 24.6 | 16.4 | 8.2 | 1.7 | 4.1 | | | | | |
| Sample 27 | 38.0 | 23.1 | 20.9 | 8.2 | 1.6 | | 4.1 | | | | |
| Sample 28 | 38.0 | 23.1 | 20.9 | 8.2 | 1.6 | | | | | | |
| Sample 29 | 37.9 | 23.1 | 20.9 | 8.2 | 1.7 | 2.0 | | | 2.0 | | |
| Sample 30 | 37.8 | 23.0 | 20.8 | 8.2 | 2.1 | 4.1 | | | | | |
| Sample 31 | 37.9 | 23.1 | 20.9 | 8.2 | 1.7 | 2.9 | | | 1.2 | | |
| Sample 32 | 38.0 | 23.1 | 20.9 | 8.2 | 1.6 | 4.1 | | | | | |
| Sample 33 | 38.0 | 23.1 | 20.9 | 8.2 | 1.6 | | | | | | |
| Sample 34 | 38.3 | 23.3 | 21.2 | 8.2 | 0.7 | 4.1 | | | | | |
| Sample 35 | 38.1 | 23.1 | 21.0 | 8.2 | 1.4 | 4.1 | | | | | |
| Sample 36 | 38.2 | 23.2 | 21.1 | 8.2 | 1.0 | 4.1 | | | | | |
| Sample 37 | 37.9 | 23.1 | 20.9 | 8.2 | 1.7 | 4.1 | | | | | |
| Sample 38 | 38.0 | 23.1 | 20.9 | 8.2 | 1.6 | 4.1 | | | | | |
| Sample 39 | 38.0 | 23.1 | 20.9 | 8.2 | 1.6 | | | | | 4.1 | |
| Sample 40 | 38.0 | 23.1 | 20.9 | 8.2 | 1.6 | 4.1 | | | | | |
| Sample 41 | 43.1 | 21.6 | 17.3 | 8.2 | 1.7 | 4.1 | | | | | |
| Sample 42 | 38.6 | 23.5 | 21.3 | 8.3 | 1.7 | | | | | 2.5 | |
| Sample 43 | 38.0 | 23.1 | 20.9 | 8.2 | 1.6 | 4.1 | | | | | |
| Sample 44 | 41.0 | 20.5 | 20.5 | 8.2 | 1.7 | 4.1 | | | | | |
| Sample 45 | 38.9 | 23.7 | 21.5 | 8.4 | 1.7 | 4.2 | | | | | |
| Sample 46 | 38.0 | 23.1 | 20.9 | 8.2 | 1.6 | | | | | | |

| Sample name | Glass composition of glass frit [mol %] | | | | | | | | | | |
|---|---|---|---|---|---|---|---|---|---|---|---|
| | $Dy_2O_3$ | $Er_2O_3$ | $Yb_2O_3$ | $SnO_2$ | $Li_2O$ | BaO | CaO | $Sb_2O_3$ | $In_2O_3$ | $P_2O_5$ | PbO |
| * Sample 1 | | | | | | | | | 4.5 | | |
| * Sample 2 | | | | 4.2 | | | | | | | |
| * Sample 3 | | | | 3.9 | | | | | | | |
| * Sample 4 | | | | 7.9 | | | | | | | |
| * Sample 5 | | | | 4.1 | | | | | | | |
| * Sample 6 | | | | | | | | | | | 8.9 |
| * Sample 7 | | | | | | 4.3 | | | | | |
| * Sample 8 | | | | 3.9 | | | | | | | |
| * Sample 9 | | | | | | | | | 4.3 | | |
| * Sample 10 | | | | | | | 4.3 | | | | |
| * Sample 11 | | | | | | | | | | | |
| * Sample 12 | | | | | | | | | | 2.6 | |
| Sample 13 | | | | 4.2 | | | | | | | |
| Sample 14 | | | | 4.2 | | | | | | | |
| Sample 15 | | 2.5 | | 4.2 | | | | | | | |
| * Sample 16 | | | | | | | | | | | |
| Sample 17 | | | | 5.6 | | | | | | | |
| Sample 18 | 2.5 | | | 4.2 | | | | | | | |
| Sample 19 | | | | 4.1 | | | | | | | |
| Sample 20 | | | | 2.5 | | | | | | | |

TABLE 2-continued

| Sample 21 | | 5.6 | |
| Sample 22 | | 3.9 | |
| Sample 23 | | 4.1 | |
| Sample 24 | | 4.1 | |
| Sample 25 | 2.5 | 4.2 | |
| Sample 26 | | 4.1 | |
| Sample 27 | | 4.1 | |
| Sample 28 | 4.1 | 4.1 | |
| Sample 29 | | 4.1 | |
| Sample 30 | | 4.1 | |
| Sample 31 | | 4.1 | |
| Sample 32 | | | 4.1 |
| Sample 33 | 4.1 | 4.1 | |
| Sample 34 | | 4.1 | |
| Sample 35 | | 4.1 | |
| Sample 36 | | 4.1 | |
| Sample 37 | | 4.1 | |
| Sample 38 | | 4.1 | |
| Sample 39 | | 4.1 | |
| Sample 40 | | | 4.1 |
| Sample 41 | | 4.1 | |
| Sample 42 | | 4.2 | |
| Sample 43 | | 4.1 | |
| Sample 44 | | 4.1 | |
| Sample 45 | | 1.7 | |
| Sample 46 | 4.1 | 4.1 | |

TABLE 3

| Sample name | Fill factor FF Measurement #1 | #2 | #3 | Fill factor FF Average | Variation [%] |
| --- | --- | --- | --- | --- | --- |
| * Sample 1 | 0.2535 | 0.2431 | 0.2428 | 0.2465 | 2.85 |
| * Sample 2 | 0.2866 | 0.3405 | 0.2793 | 0.3021 | 12.70 |
| * Sample 3 | 0.3904 | 0.4559 | 0.4056 | 0.4173 | 9.25 |
| * Sample 4 | 0.5021 | 0.4635 | 0.6471 | 0.5376 | 20.38 |
| * Sample 5 | 0.5033 | 0.6427 | 0.4785 | 0.5415 | 18.69 |
| * Sample 6 | 0.5722 | 0.5966 | 0.5902 | 0.5863 | 2.41 |
| * Sample 7 | 0.6044 | 0.6009 | 0.6231 | 0.6095 | 2.24 |
| * Sample 8 | 0.6336 | 0.6540 | 0.6153 | 0.6343 | 3.11 |
| * Sample 9 | 0.5855 | 0.7652 | 0.6193 | 0.6567 | 16.53 |
| * Sample 10 | 0.7091 | 0.7187 | 0.6777 | 0.7018 | 3.44 |
| * Sample 11 | 0.7213 | 0.7605 | 0.6768 | 0.7195 | 5.94 |
| * Sample 12 | 0.7069 | 0.7523 | 0.7106 | 0.7233 | 4.01 |
| Sample 13 | 0.7116 | 0.7224 | 0.7565 | 0.7302 | 3.61 |
| Sample 14 | 0.7233 | 0.7198 | 0.7518 | 0.7316 | 2.76 |
| Sample 15 | 0.7689 | 0.7121 | 0.7523 | 0.7444 | 4.34 |
| * Sample 16 | 0.6825 | 0.7908 | 0.7700 | 0.7478 | 8.73 |
| Sample 17 | 0.7310 | 0.7721 | 0.7588 | 0.7540 | 3.05 |
| Sample 18 | 0.7436 | 0.7827 | 0.7623 | 0.7629 | 2.60 |
| Sample 19 | 0.7688 | 0.7393 | 0.7876 | 0.7652 | 3.39 |
| Sample 20 | 0.7622 | 0.7695 | 0.7811 | 0.7709 | 1.32 |
| Sample 21 | 0.7836 | 0.7741 | 0.7630 | 0.7736 | 1.37 |
| Sample 22 | 0.7837 | 0.7650 | 0.7745 | 0.7744 | 1.21 |
| Sample 23 | 0.7892 | 0.7664 | 0.7704 | 0.7753 | 1.79 |
| Sample 24 | 0.7986 | 0.7519 | 0.7767 | 0.7757 | 3.07 |
| Sample 25 | 0.8004 | 0.7764 | 0.7559 | 0.7776 | 2.94 |
| Sample 26 | 0.7820 | 0.7847 | 0.7678 | 0.7782 | 1.33 |
| Sample 27 | 0.7655 | 0.7991 | 0.7734 | 0.7793 | 2.54 |
| Sample 28 | 0.7922 | 0.7835 | 0.7813 | 0.7857 | 0.83 |
| Sample 29 | 0.7999 | 0.7803 | 0.7851 | 0.7884 | 1.45 |
| Sample 30 | 0.7944 | 0.7933 | 0.7796 | 0.7891 | 1.20 |
| Sample 31 | 0.7895 | 0.7988 | 0.7796 | 0.7893 | 1.23 |
| Sample 32 | 0.7758 | 0.7960 | 0.8007 | 0.7908 | 1.90 |
| Sample 33 | 0.7910 | 0.7993 | 0.7834 | 0.7912 | 1.02 |
| Sample 34 | 0.7875 | 0.7927 | 0.7955 | 0.7919 | 0.56 |
| Sample 35 | 0.7913 | 0.7867 | 0.8002 | 0.7927 | 0.94 |
| Sample 36 | 0.7933 | 0.8010 | 0.7901 | 0.7948 | 0.78 |
| Sample 37 | 0.8007 | 0.8001 | 0.7863 | 0.7957 | 1.18 |
| Sample 38 | 0.7966 | 0.7971 | 0.7948 | 0.7962 | 0.17 |
| Sample 39 | 0.7948 | 0.7970 | 0.7983 | 0.7967 | 0.24 |
| Sample 40 | 0.7927 | 0.8023 | 0.7955 | 0.7968 | 0.69 |
| Sample 41 | 0.7952 | 0.8048 | 0.7924 | 0.7975 | 0.92 |
| Sample 42 | 0.8048 | 0.7926 | 0.7973 | 0.7982 | 0.82 |
| Sample 43 | 0.8045 | 0.8017 | 0.7957 | 0.8006 | 0.62 |
| Sample 44 | 0.8025 | 0.8019 | 0.8034 | 0.8026 | 0.10 |
| Sample 45 | 0.8048 | 0.8000 | 0.8044 | 0.8031 | 0.38 |
| Sample 46 | 0.8038 | 0.8050 | 0.8066 | 0.8051 | 0.18 |

As described above, according to the present invention, it is possible to obtain a conductive paste for forming a solar cell electrode that has a wide window of the firing temperature, has better electric characteristics, and has a stronger adhesion strength to a substrate.

REFERENCE SIGNS LIST

1 Surface electrode
2 Anti-reflection film
3 Diffusion layer
4 Substrate
5 Back electrode
6 Glass layer

The invention claimed is:
1. A conductive paste for forming a solar cell electrode comprising:
   conductive powder (I);
   glass frit (II); and
   an organic vehicle (III), wherein
   at least a glass frit component (A) is contained as the glass frit (II), and the glass frit component (A) contains the following as essential components in a content ratio to a total molar number in terms of oxide:
(a) 30 to 70 mol % of tellurium element in terms of $TeO_2$,
(b) 18 to 30 mol % of tungsten element in terms of $WO_3$, (c) 5 to 30 mol % of zinc element in terms of $ZnO$, (d) 1 to 15 mol % of boron element in terms of $B_2O_3$, (e) 0.3 to 5 mol % of aluminum element in terms of $Al_2O_3$, (f) 0.3 to 7 mol % of one selected from rare earth elements other than scandium and promethium in terms of oxide, or 0.3 to 7 mol % of each of two or more selected from rare earth elements other than scandium and promethium in terms of oxide and 10 mol % or less in total, and

(g) 0.1 to 7 mol % of one selected from the group consisting of tin, lithium, and barium elements in terms of SnO2, Li2O, or BaO, or 0.1 to 7 mol % of each of two or more selected from the group consisting of tin, lithium, and barium elements in terms of SnO2, Li2O, or BaO and 10 mol % or less in total.

2. The conductive paste for forming a solar cell electrode according to claim 1, wherein the rare earth element (f) is one or more selected from the group consisting of yttrium, lanthanum, cerium, praseodymium, neodymium, samarium, gadolinium, dysprosium, erbium, and ytterbium.

3. The conductive paste for forming a solar cell electrode according to claim 1 or 2, wherein the glass frit (A) is made of a substantially lead-free glass frit component.

4. The conductive paste for forming a solar cell electrode according to claim 1, wherein the glass frit component (A) contains the following as essential components in the content ratio to the total molar number in terms of oxide: (a) 30 to 50 mol % of tellurium element in terms of TeO2, (b) 18 to 27 mol % of tungsten element in terms of WO3, (c) 10 to 25 mol % of zinc element in terms of ZnO, (d) 5 to 15 mol % of boron element in terms of B2O3, (e) 0.3 to 3 mol % of aluminum element in terms of Al2O3, (f) 0.5 to 7 mol % of one selected from rare earth elements other than scandium and promethium in terms of oxide, or 0.5 to 7 mol % of each of two or more selected from rare earth elements other than scandium and promethium in terms of oxide and 10 mol % or less in total, and (g) 0.3 to 7 mol % of one selected from the group consisting of tin, lithium, and barium elements in terms of SnO2, Li2O, or BaO, or 0.3 to 7 mol % of each of two or more selected from the group consisting of tin, lithium, and barium elements in terms of SnO2, Li2O, or BaO and 10 mol % or less in total.

5. The conductive paste for forming a solar cell electrode according to claim 1, wherein the conductive powder (I) is metal powder containing silver.

6. The conductive paste for forming a solar cell electrode according to claim 1, wherein the amount of the glass frit (A) is 0.1 to 10 parts by weight based on 100 parts by weight of the conductive powder (I).

* * * * *